United States Patent
Lee et al.

(10) Patent No.: US 9,520,571 B2
(45) Date of Patent: *Dec. 13, 2016

(54) ORGANIC PHOTOELECTRIC DEVICE AND IMAGE SENSOR

(71) Applicant: Samsung Electronics Co., Ltd., Suwon-Si, Gyeonggi-Do (KR)

(72) Inventors: Kwang Hee Lee, Yongin-si (KR); Kyu Sik Kim, Yongin-si (KR); Kyung Bae Park, Hwaseong-si (KR); Dong-Seok Leem, Hwaseong-si (KR); Seon-Jeong Lim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 652 days.

This patent is subject to a terminal disclaimer.

(21) Appl. No.: 13/943,834

(22) Filed: Jul. 17, 2013

(65) Prior Publication Data

US 2014/0097416 A1     Apr. 10, 2014

(30) Foreign Application Priority Data

Oct. 8, 2012   (KR) .................. 10-2012-0111356

(51) Int. Cl.
  *H01L 51/50* (2006.01)
  *H01L 51/00* (2006.01)
  *H01L 51/42* (2006.01)

(52) U.S. Cl.
  CPC ......... *H01L 51/008* (2013.01); *H01L 51/0069* (2013.01); *H01L 51/0072* (2013.01); *H01L 51/4253* (2013.01)

(58) Field of Classification Search
  None
  See application file for complete search history.

(56) References Cited

U.S. PATENT DOCUMENTS

| 6,368,395 | B1 | 4/2002 | Nohr et al. |
| 6,566,807 | B1 * | 5/2003 | Fujita ................ H01L 51/5012 313/504 |
| 2003/0087125 | A1 | 5/2003 | Aziz et al. |
| 2004/0256554 | A1 | 12/2004 | Hiramoto et al. |

(Continued)

FOREIGN PATENT DOCUMENTS

| JP | H11-024255 | 1/1999 |
| JP | 2006-124593 A | 5/2006 |

(Continued)

OTHER PUBLICATIONS

Morse et al., Boron Subphthalocyanines as Organic Electronic Materials, 2012, Applied Materials & Interfaces, vol. 4, pp. 5055-5068.*

Hokuto Seo et al., Color Sensors With Three Vertically Stacked Organic Photodetectors, Japanese Journal of Applied Physics, vol. 46, 2007, pp. L1240-L1242.

(Continued)

*Primary Examiner* — Gregory Clark
(74) *Attorney, Agent, or Firm* — Harness, Dickey & Pierce, P.L.C.

(57) ABSTRACT

An organic photoelectric device may include a first electrode and a second electrode facing each other and an active layer between the first electrode and the second electrode, the active layer including a compound represented by Chemical Formula 1 and a compound represented by Chemical Formula 2. An image sensor may include the organic photoelectric device.

18 Claims, 11 Drawing Sheets

(56) References Cited

U.S. PATENT DOCUMENTS

| | | |
|---|---|---|
| 2007/0272918 A1 | 11/2007 | Rand et al. |
| 2008/0030802 A1* | 2/2008 | Tsou ................. H01L 27/14678 358/482 |
| 2009/0026379 A1 | 1/2009 | Yaegashi et al. |
| 2009/0050881 A1 | 2/2009 | Hayashi |
| 2009/0223566 A1 | 9/2009 | Mitsui et al. |
| 2010/0036134 A1 | 2/2010 | Mori et al. |
| 2011/0253992 A1 | 10/2011 | Rand et al. |
| 2011/0297234 A1 | 12/2011 | Forrest et al. |
| 2012/0090685 A1 | 4/2012 | Forrest et al. |
| 2013/0112947 A1 | 5/2013 | Lee et al. |
| 2014/0097416 A1 | 4/2014 | Lee et al. |

FOREIGN PATENT DOCUMENTS

| | | |
|---|---|---|
| JP | 2007-063437 A | 3/2007 |
| JP | 2008-206016 A | 9/2008 |
| JP | 2011-032443 A | 2/2011 |
| JP | 2011-140639 A | 7/2011 |
| KR | 20130050082 A | 5/2013 |

OTHER PUBLICATIONS

Satoshi Aihara et al., Stacked Image Sensor With Green- and Red-Sensitive Organic Photoconductive Films Applying Zinc Oxide Thin-Film Transistors to a Signal Readout Circuit, IEEE Transactions on Electron Devices, vol. 56, 2009, pp. 2570-2576.

Ihama, et al. "CMOS Image Sensor with a Thin Overlaid Panchromatic Organic Photoconductive Layer for Sensors with Reduced Pixel Size," Fujifilm Corporation; International Display Workshops, pp. 2123-2126 (2009).

Baierl, et al. "A hybrid CMOS-imager with a solution-processable polymer as photoactive layer," Macmillan Publishers Limited, Nature Communications, vol. 3, article 1175, pp. 1-8, (2012).

Lee, et al. "A high performance green-sensitive organic photodiode comprising a bulk heterojunction of dimethyl-quinacridone and dicyanovinyl terthiophene", Royal Society of Chemistry Publishing, Joural of Materials Chemistry C, vol. 1, pp. 2666-2671, (2013).

Korean Search Report dated Jan. 21, 2013.

Morse, "Engineering Boronsubphthalocyanine for Organic Electronic Applications", Doctoral Thesis, Chemical Engineering and Applied Chemistry, University of Toronto, pp. 1-358 (2012).

\* cited by examiner

ORGANIC PHOTOELECTRIC DEVICE AND IMAGE SENSOR

CROSS REFERENCE TO RELATED APPLICATION

This application claims priority to and the benefit of Korean Patent Application No. 10-2012-0111356 filed in the Korean Intellectual Property Office on Oct. 8, 2012, the entire contents of which are incorporated herein by reference.

BACKGROUND

1. Field

Example embodiments relate to an organic photoelectric device and an image sensor including the same.

2. Description of the Related Art

A photoelectric device refers to a device for converting light into an electrical signal using photoelectric effects. The photoelectric device may include a photodiode and/or a phototransistor, and may be applied to an image sensor and/or a solar cell.

An image sensor including a photodiode requires higher resolution and accordingly a smaller pixel. At present, a silicon photodiode is widely used, but has a problem of deteriorated sensitivity because of its relatively small absorption area due to smaller pixels. Accordingly, an organic photoelectric material that is capable of replacing silicon has been researched.

The organic material has a relatively high extinction coefficient and selectively absorbs light in a particular wavelength region depending on a molecular structure, and thus may simultaneously replace a photodiode and a color filter and resultantly improve sensitivity and contribute to relatively high integration.

SUMMARY

Example embodiments provide an organic photoelectric device selectively absorbing light in a green wavelength region and improving efficiency. Example embodiments also provide an image sensor including the organic photoelectric device.

According to example embodiments, an organic photoelectric device includes a first electrode and a second electrode facing each other, and an active layer between the first electrode and the second electrode, the active layer including a compound represented by the following Chemical Formula 1 and a compound represented by the following Chemical Formula 2.

[Chemical Formula 1]

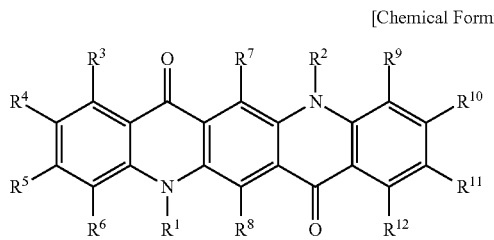

In Chemical Formula 1,

Each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, and a combination thereof, and Each of $R^3$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, a halogen atom, a halogen-containing group, and a combination thereof.

[Chemical Formula 2]

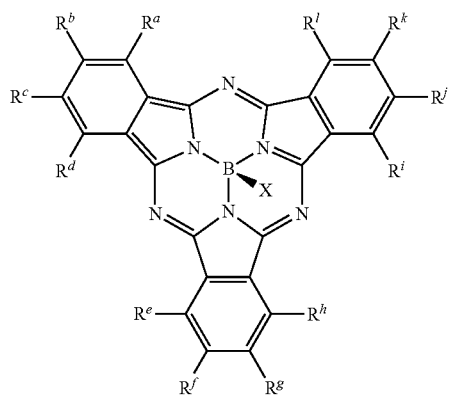

In Chemical Formula 2,

Each of $R^a$ to $R^l$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is an anion.

The compound represented by the above Chemical Formula 1 may include at least one selected from compounds represented by the following Chemical Formulae 1a to 1e.

[Chemical Formula 1a]

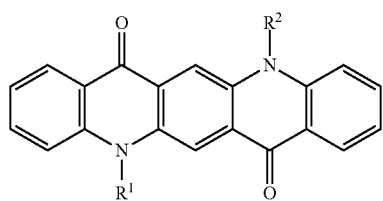

[Chemical Formula 1b]

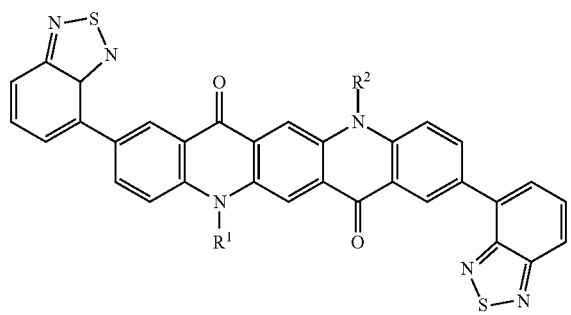

-continued

[Chemical Formula 1c]

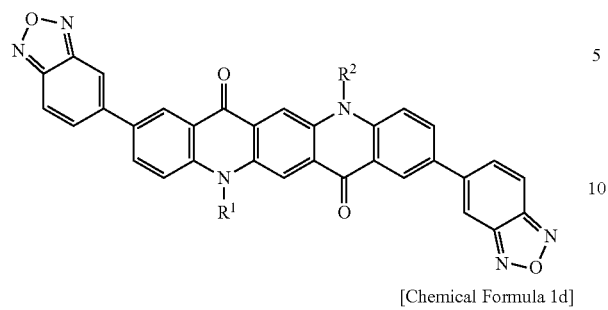

[Chemical Formula 1d]

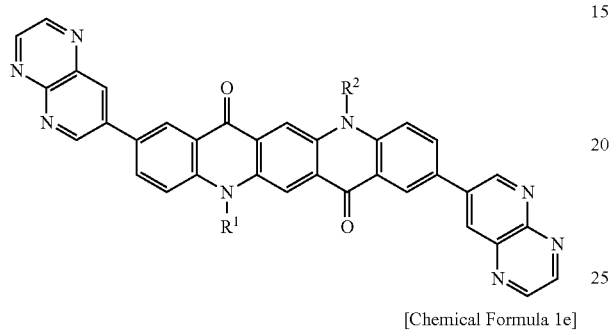

[Chemical Formula 1e]

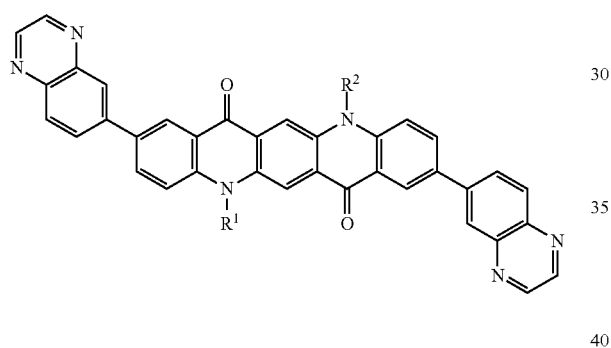

In Chemical Formulae 1a to 1e,

Each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

At least one of $R^a$ to $R^I$ of Chemical Formula 2 may include a halogen atom.

The compound represented by the above Chemical Formula 2 may include at least one of compounds represented by the following Chemical Formulae 2a to 2e.

[Chemical Formula 2a]

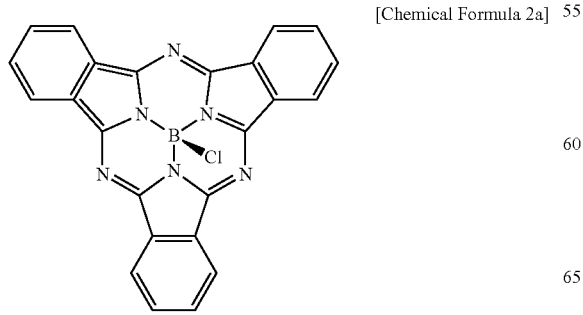

[Chemical Formula 2b]

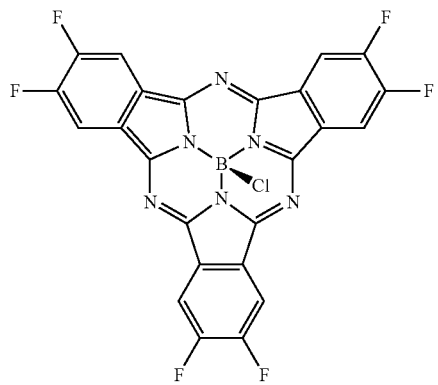

[Chemical Formula 2c]

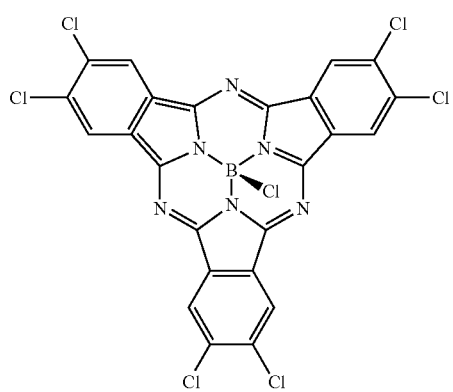

[Chemical Formula 2d]

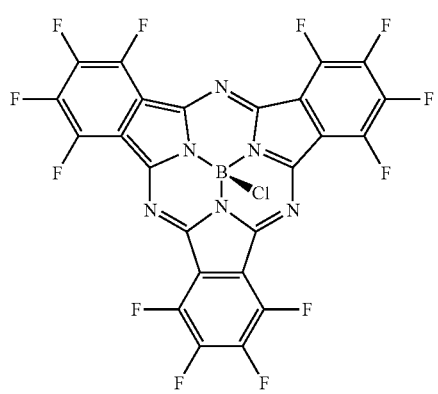

[Chemical Formula 2e]

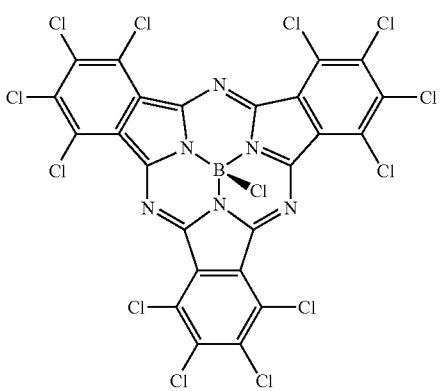

The compound represented by the above Chemical Formula 1 may be a p-type semiconductor, and the compound represented by the above Chemical Formula 2 may be an n-type semiconductor.

The active layer may selectively absorb light in a green wavelength region.

The active layer may have a maximum absorption peak in a wavelength region of about 500 nm to about 600 nm.

The active layer may have a light-absorption curved line having a full width at half maximum (FWHM) of about 50 nm to about 150 nm.

The active layer may include an intrinsic layer including the compound represented by the above Chemical Formula 1 and the compound represented by the above Chemical Formula 2 at a ratio of about 1:100 to about 100:1.

The active layer may include the intrinsic layer including the compound represented by the above Chemical Formula 1 and the compound represented by the above Chemical Formula 2 at a ratio of about 1:10 to about 10:1.

The active layer may further include a p-type layer including the compound represented by the above Chemical Formula 1. The active layer may further include an n-type layer including the compound represented by the above Chemical Formula 2.

The active layer may further include a p-type layer on one side of the intrinsic layer and including the compound represented by the above Chemical Formula 1, and an n-type layer on the other side of the intrinsic layer and including the compound represented by the above Chemical Formula 2.

The active layer may include a p-type layer including the compound represented by the above Chemical Formula 1 and an n-type layer including the compound represented by the above Chemical Formula 2.

The organic photoelectric device may further include a charge auxiliary layer between at least one of the first electrode and the second electrode and the active layer. The first electrode may be an anode and the second electrode may be a cathode.

According to example embodiments, an image sensor includes the organic photoelectric device.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
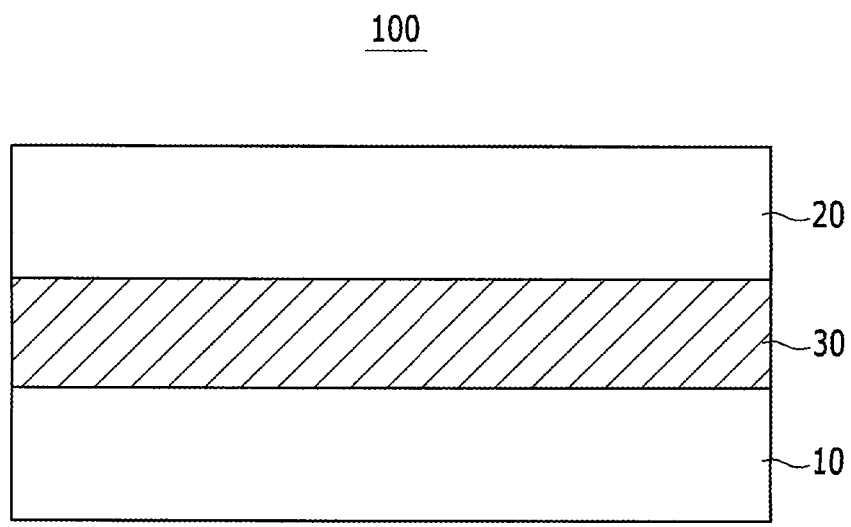
FIG. 1 is a cross-sectional view showing an organic photoelectric device according to example embodiments.

The present disclosure will be described more fully hereinafter with reference to the accompanying drawings, in which example embodiments are shown. This disclosure may, however, be embodied in many different forms and is not construed as limited to the example embodiments set forth herein.

As used herein, when a definition is not otherwise provided, the term "substituted" refers to one substituted with at least a functional group selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_4$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_2$ to $C_{20}$ heterocycloalkyl group, and a combination thereof, instead of hydrogen of a compound.

As used herein, when specific definition is not otherwise provided, the term "hetero" refers to one including 1 to 3 heteroatoms selected from N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

An organic photoelectric device according to example embodiments is described referring to FIG. 1. FIG. 1 is a cross-sectional view showing an organic photoelectric device according to example embodiments.

Referring to FIG. 1, an organic photoelectric device 100 according to example embodiments may include a first electrode (e.g., anode) 10 and second electrode (e.g., cathode) 20 facing each other, and an active layer 30 interposed between the first electrode (e.g., anode) 10 and second electrode (e.g., cathode) 20. FIG. 1 shows that the first electrode (e.g., anode) 10 is positioned under the active layer 30, while the second electrode (e.g., cathode) 20 is positioned on the active layer 30. However, the second electrode (e.g., cathode) 20 may be positioned under the active layer 30, and the first electrode (e.g., anode) 10 may be positioned on the active layer 30.

One of the first electrode (e.g., anode) 10 and second electrode (e.g., cathode) 20 may be made of, for example, a conductive oxide (e.g., indium tin oxide (ITO) or indium zinc oxide (IZO)), and the other may be made of, for example, an opaque conductor (e.g., aluminum (Al)).

The active layer 30 may include p-type semiconductor material and n-type semiconductor material to form a pn junction, and externally receives light, generates excitons, and separates the excitons into holes and electrons.

The active layer 30 may include a compound represented by the following Chemical Formula 1 and a compound represented by the following Chemical Formula 2.

[Chemial Formula 1]

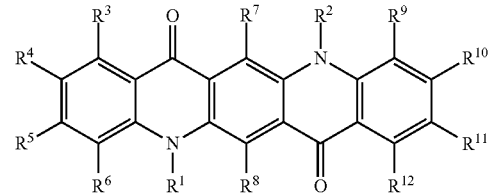

In Chemical Formula 1,
Each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, and a combination thereof, and
Each of $R^3$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, a halogen atom, a halogen-containing group, and a combination thereof.

[Chemical Formula 2]

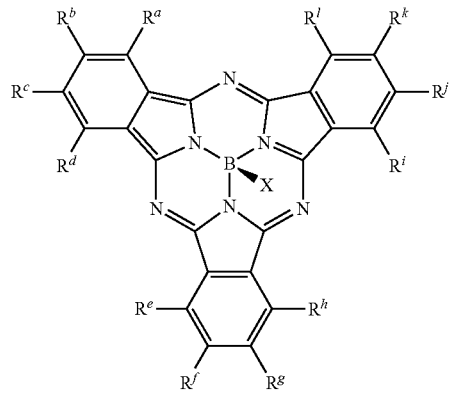

In Chemical Formula 2,
Each of $R^a$ to $R^l$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and
X is an anion.

The compound represented by the above Chemical Formula 1 may include at least one selected from compounds represented by the following Chemical Formulae 1a to 1e.

[Chemical Formula 1a]

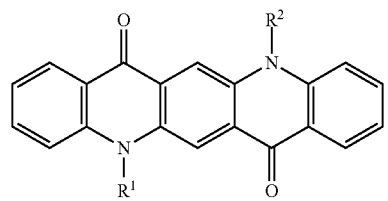

-continued

[Chemical Formula 1b]

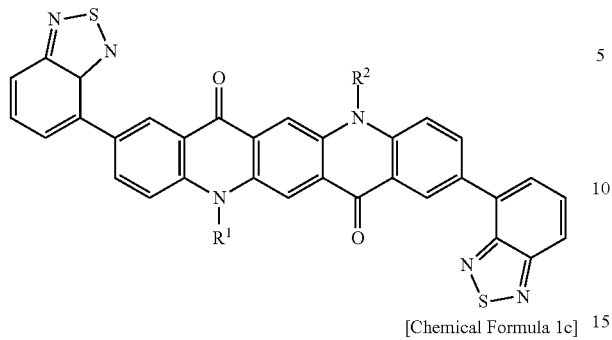

[Chemical Formula 1c]

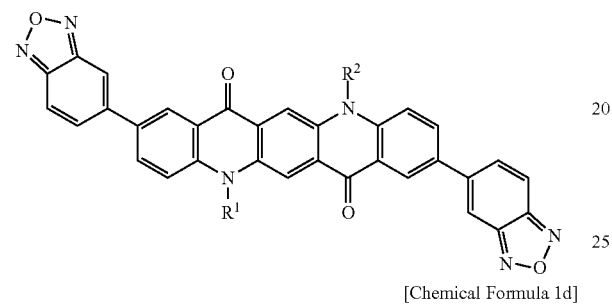

[Chemical Formula 1d]

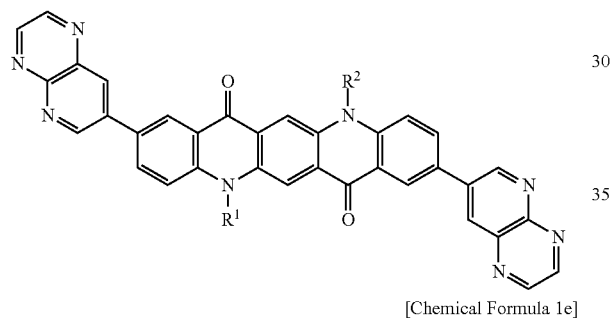

[Chemical Formula 1e]

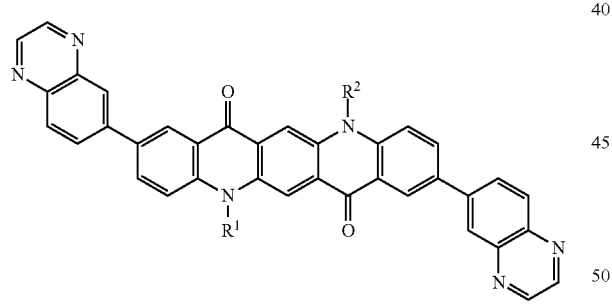

In Chemical Formulae 1a to 1e,

Each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

The compound represented by the above Chemical Formula 2 may include, for example, at least one halogen atom, and for example at least one of $R^a$ to $R^l$ of the above Chemical Formula 2 may include a halogen atom.

The compound represented by the above Chemical Formula 2 may include at least one of compounds represented by the following Chemical Formulae 2a to 2e.

[Chemical Formula 2a]

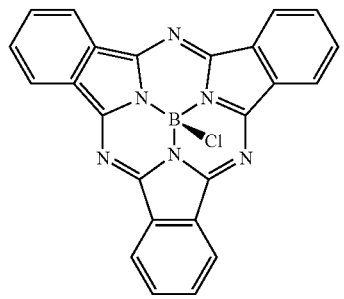

[Chemical Formula 2b]

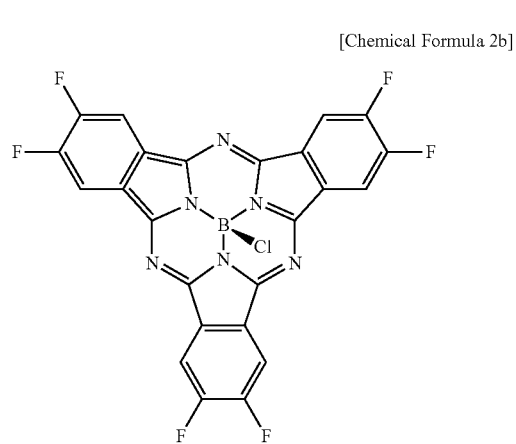

[Chemical Formula 2c]

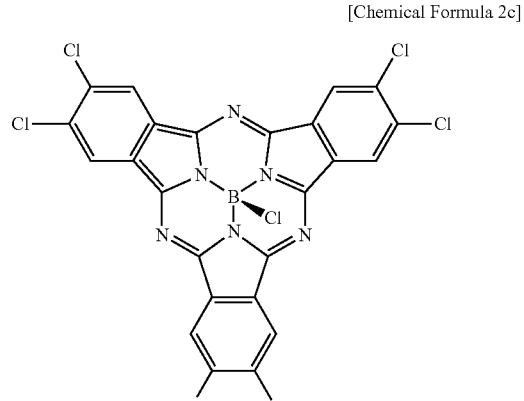

[Chemical Formula 2d]

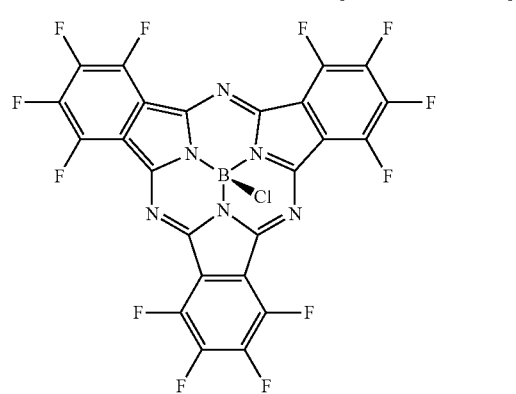

[Chemical Formula 2e]

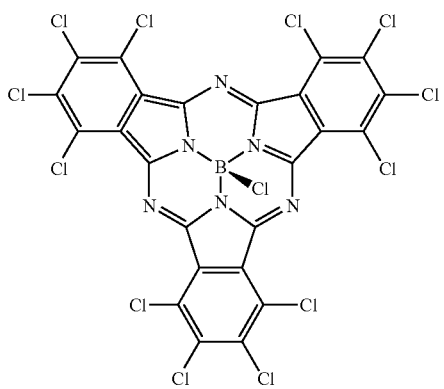

The compound represented by the above Chemical Formula 1 may be a p-type semiconductor, and the compound represented by the above Chemical Formula 2 may be an n-type semiconductor.

The compound represented by the above Chemical Formula 1 and the compound represented by the above Chemical Formula 2 may have a bandgap of about 1.5 eV to 3.5 eV, respectively. Within the range, the compounds may have a bandgap of about 2.0 eV to 2.5 eV. When p-type and n-type semiconductor materials in an active layer respectively have a bandgap within the range, the active layer may absorb light in a green wavelength, for example, have a maximum absorption peak in a wavelength region ranging from about 500 nm to 600 nm.

The active layer including the compounds represented by the above Chemical Formulae 1 and 2 may have a full width at half maximum (FWHM) ranging from about 50 nm to 150 nm in a light-absorption curve. Herein, the full width at half maximum is a wavelength width corresponding to a half of maximum light-absorption. When the full width at half maximum is relatively small, light in a narrow wavelength region is selectively absorbed, increasing wavelength selectivity. The active layer has a full width at half maximum within the range and may have relatively high selectivity for a green wavelength region.

The compounds represented by the above Chemical Formulae 1 and 2 have a LUMO energy level difference ranging from about 0.2 eV to 0.7 eV. The LUMO energy level difference may be about 0.3 eV to 0.5 eV within the range. When the p-type and n-type semiconductors in an active layer have a LUMO energy level difference within the range, external quantum efficiency (EQE) may be improved and effectively adjusted depending on a bias applied thereto.

The active layer 30 may be a single layer or multi-layer. The active layer 30 may be, for example, an intrinsic layer (I layer) or various combinations of a p-type layer/n-type layer, a p-type layer/I layer, an I layer/n-type layer, and a p-type layer/I layer/n-type layer.

The intrinsic layer may include the compound represented by the above Chemical Formula 1 and the compound represented by the above Chemical Formula 2 at a ratio of about 1:100 to about 100:1. The two compounds may be included in a ratio ranging from about 1:50 to about 50:1 within the range, for example, about 1:10 to about 10:1, or about 1:1. When the p-type and n-type semiconductors have a composition ratio within the range, an exciton may be effectively generated, and a pn junction may be effectively formed.

The p-type layer may include the compound represented by the above Chemical Formula 1, and the n-type layer may include the compound represented by the above Chemical Formula 2.

The active layer 30 may have a thickness ranging from about 1 nm to 500 nm. The active layer 30 may have a thickness about 5 nm to 300 nm within the range. When the active layer 30 has a thickness within the range, the active layer may effectively absorb light, effectively separate and transmit holes and electrons, effectively improving photoelectric conversion efficiency.

In the organic photoelectric device 100, when light is incident from the first electrode (e.g., anode) 10 and/or second electrode (e.g., cathode) 20, and when the active layer 30 absorbs light having a predetermined or given wavelength region, excitons may be generated from the inside. The excitons are separated into holes and electrons at the active layer 30, and the separated holes are transferred to the first electrode (e.g., anode) 10 and the separated electrons are transferred to the second electrode (e.g., cathode) 20, so as to flow a current in the organic photoelectric device.

Figure 2:
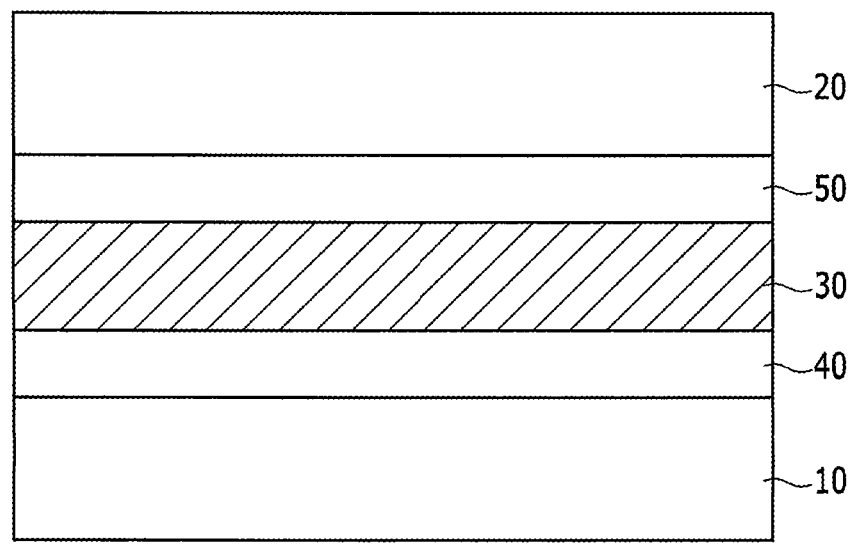
FIG. 2 is a cross-sectional view showing an organic photoelectric device according to example embodiments.

Referring to FIG. 2, an organic photoelectric device according to example embodiments is described. FIG. 2 is a cross-sectional view showing an organic photoelectric device according to example embodiments.

Referring to FIG. 2, an organic photoelectric device 100 according to example embodiments may include an first electrode (e.g., anode) 10, a second electrode (e.g., cathode) 20, and an active layer 30 interposed between the first electrode (e.g., anode) 10 and the second electrode (e.g., cathode) 20.

However, the organic photoelectric device 100 according to example embodiments may further include charge auxiliary layers 40 and 50 respectively between the first electrode (e.g., anode) 10 and active layer 30 and between second electrode (e.g., cathode) 20 and the active layer 30. The charge auxiliary layers 40 and 50 may further facilitate the transportation of holes and electrons separated from the active layer 30, so as to increase efficiency.

The charge auxiliary layer 40 may be at least one selected from a hole injection layer (HIL) for facilitating hole injection, a hole transport layer (HTL) for facilitating hole transport, and an electron blocking layer (EBL) for preventing or inhibiting electron transport. The charge auxiliary layer 50 may be at least one selected from an electron injection layer (EIL) for facilitating electron injection, an electron transport layer (ETL) for facilitating electron transport, and a hole blocking layer (HBL) for preventing or inhibiting hole transport.

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]piphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]piphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 40 and 50 may be omitted.

The organic photoelectric device may be applied to various fields, for example a solar cell, an image sensor, a photo-detector, a photo-sensor, and an organic light emitting diode (OLED), but is not limited thereto.

Hereinafter, an example of an image sensor including the organic photoelectric device is described referring to drawings. As an example of an image sensor, an organic CMOS image sensor is described.

Figure 3:
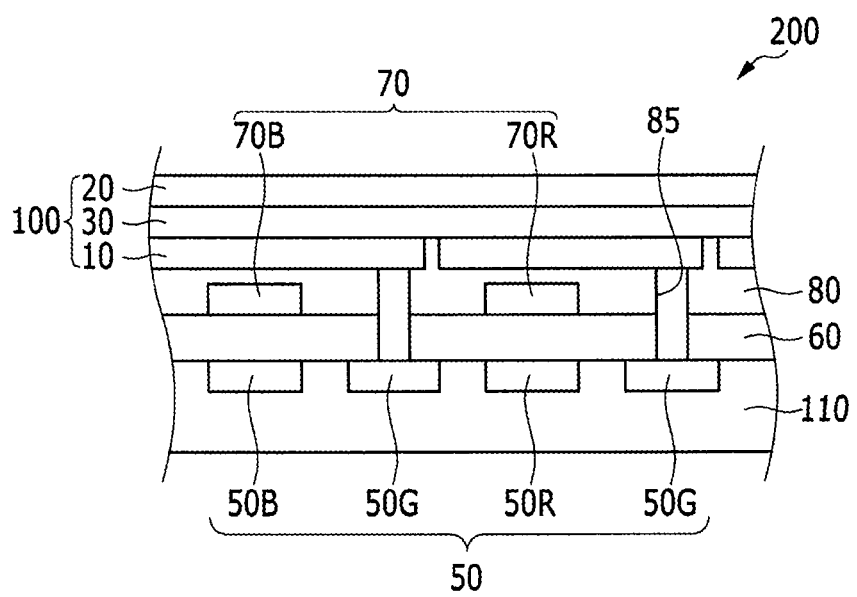
FIG. 3 is a cross-sectional view showing an organic CMOS image sensor according to example embodiments.

FIG. 3 is a cross-sectional view showing an organic CMOS image sensor according to example embodiments.

FIG. 3 explains adjacent blue, green, and red pixels, but is not limited thereto. Hereinafter, a constituent element including "B" in the reference symbol refers to a constituent element included in the blue pixel, a constituent element including "G" refers to a constituent element included in the green pixel, and a constituent element including "R" in the reference symbol refers to a constituent element included in the red pixel.

Referring to FIG. 3, an organic CMOS image sensor 200 includes a semiconductor substrate 110 integrated with a photo-sensing device 50 and a transmission transistor (not shown), a lower insulation layer 60, color filters 70B and 70R, an upper insulation layer 80, and an organic photoelectric device 100.

The semiconductor substrate 110 may be a silicon substrate, and is integrated with the photo-sensing device 50 and the transmission transistor (not shown). The photo-sensing device 50 may be a photodiode. The photo-sensing device 50 and the transmission transistor may be integrated in each pixel, and as shown in the drawing, the photo-sensing device 50 includes a blue pixel photo-sensing device 50B, at least one green pixel photo-sensing device 50G, and a red pixel photo-sensing device 50R. The photo-sensing device 50 senses light, and the information sensed by the photo-sensing device 50 is transferred by the transmission transistor.

Metal wires (not shown) and pads (not shown) are formed on the semiconductor substrate 110. In order to decrease signal delay, the metal wires and pads may be made of a metal having relatively low resistivity, for example, aluminum (Al), copper (Cu), silver (Ag), and alloys thereof, but is not limited thereto.

The lower insulation layer 60 may be formed on the metal wires and pads. The lower insulation layer 60 may be made of an inorganic insulating material (e.g., silicon oxide and/or silicon nitride), or a low dielectric constant (low K) material (e.g., SiC, SiCOH, SiCO, and SiOF).

The lower insulation layer 60 has a trench (not shown) exposing each photo-sensing device 50B, 50G, and 50R of each pixel. The trench may be filled with fillers.

A color filter 70 may be formed on the lower insulation layer 60. The color filter 70 may include the blue filter 70B formed in the blue pixel and the red filter 70R formed in the red pixel. In example embodiments, a green filter is not included, but a green filter may be further included.

The upper insulation layer 80 is formed on the color filter 70. The upper insulation layer 80 eliminates a step-difference by the color filters 70 and smoothes the surface. The upper insulation layer 80 and lower insulation layer 60 may include a contact hole (not shown) exposing a pad and a through-hole 85 exposing the photo-sensing device 50G of a green pixel.

The organic photoelectric device 100 is formed on the upper insulation layer 80. The organic photoelectric device 100 includes an first electrode (e.g., anode) 10, an active layer 30, and a second electrode (e.g., cathode) 20 as described. However, the positions of the first electrode (e.g., anode) 10 and second electrode (e.g., cathode) 20 may be exchanged with each other. For better understanding and ease of description, the organic photoelectric device 100 according to example embodiments as illustrated in FIG. 1 is shown, but is not limited thereto, and all organic photoelectric devices 100 according to example embodiments may be applicable.

Both of the first electrode (e.g., anode) 10 and the second electrode (e.g., cathode) 20 may be light-transmission electrodes. The active layer 30 includes a p-type semiconductor represented by Chemical Formula 1 and an n-type semiconductor represented by Chemical Formula 2 and selectively absorbs light in a green wavelength region as aforementioned, and may replace a color filter of green pixels.

When light enters from the second electrode (e.g., cathode) 20, the light in a green wavelength region may be mainly absorbed in the active layer 30 and photoelectrically converted, while the light in the rest of wavelength regions passes the first electrode (e.g., anode) 10 and may be sensed in a photo-sensing device 50.

Hereinafter, the present disclosure is illustrated in more detail with reference to examples. However, these embodiments are examples, and the present disclosure is not limited thereto.

Light-Absorption Characteristic of P-Type Semiconductor

Compounds represented by the following Chemical Formula 1a' to 1e' are prepared.

[Chemical Formula 1a']

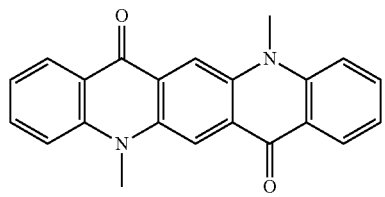

[Chemical Formula 1b']

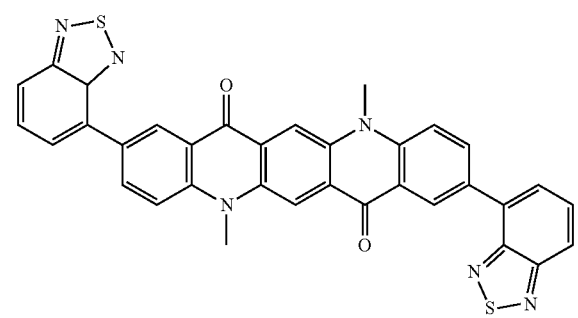

[Chemical Formula 1c']

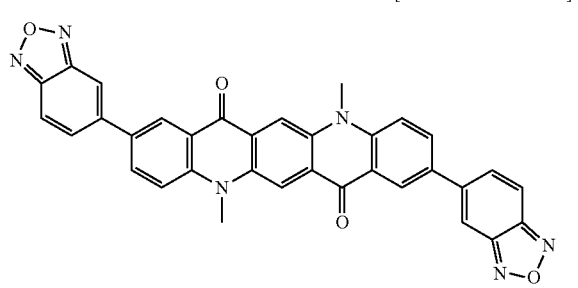

[Chemical Formula 1d']

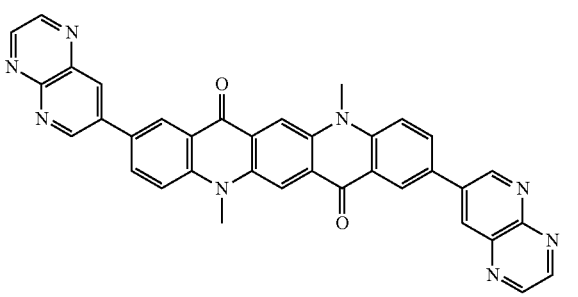

[Chemical Formula 1e']

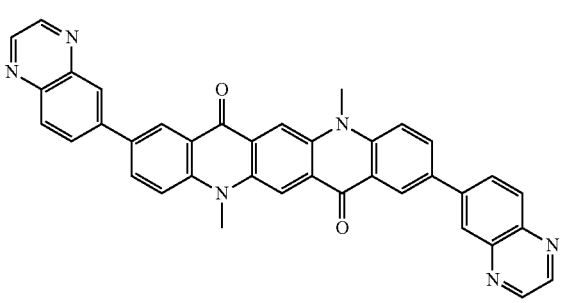

The compounds represented by the above Chemical Formulae 1a' to 1e' are evaluated regarding light-absorption characteristic depending on a wavelength. The light-absorption characteristic may be evaluated by radiating an ultraviolet (UV)-visible ray (UV-Vis) using a Cary 5000 UV spectroscope (Varian Inc.).

Figure 4:
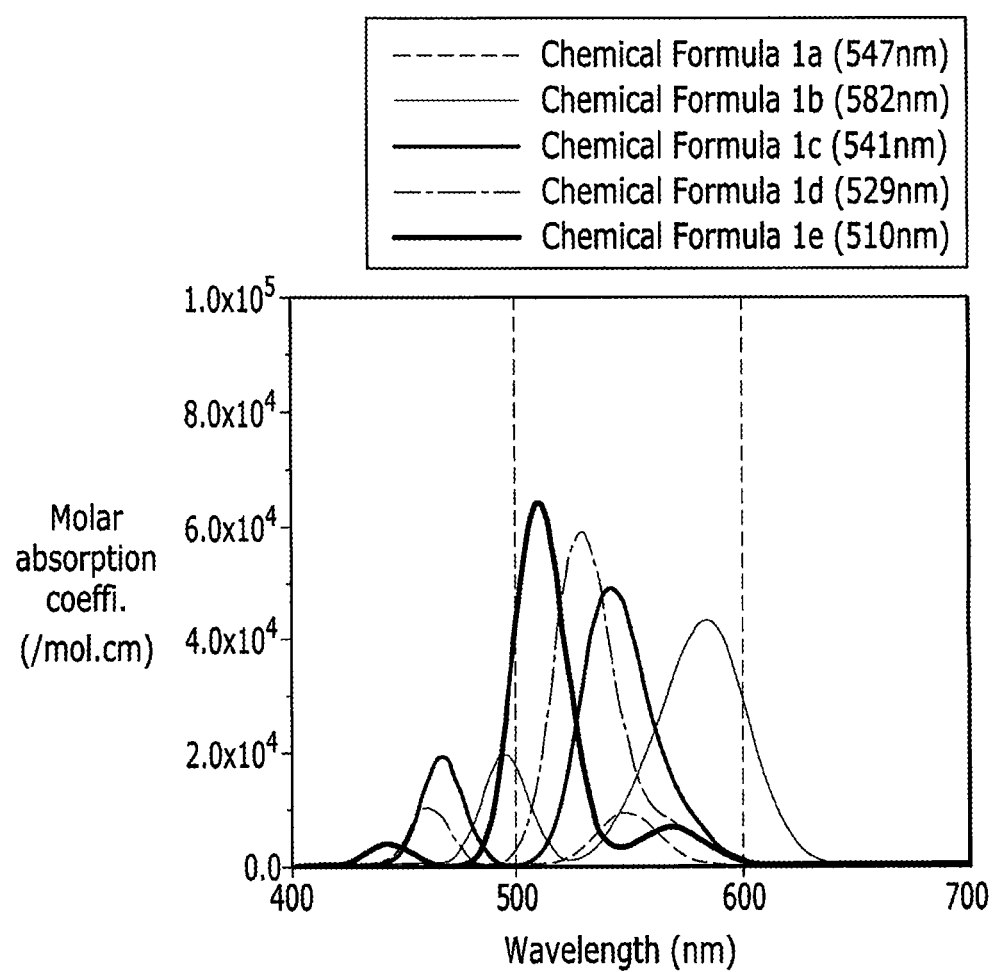
FIG. 4 is a graph showing the extinction coefficient of compounds represented by Chemical Formula 1a' to 1e' depending on a wavelength.

FIG. 4 is a graph showing extinction coefficients of the compounds represented by Chemical Formulae 1a' to 1e' depending on a wavelength.

Referring to FIG. 4, the compounds represented by the above Chemical Formulae 1a' to 1e' have a maximum absorption peak in a wavelength region of about 500 nm to about 600 nm, and thus may selectively absorb light in a green wavelength region. In addition, the compound has a sharp peak in the wavelength region and may increase sensitivity and color purity.

Light-Absorption Characteristic of N-Type Semiconductor

A compound represented by the following Chemical Formula 2a is prepared.

[Chemical Formula 2a]

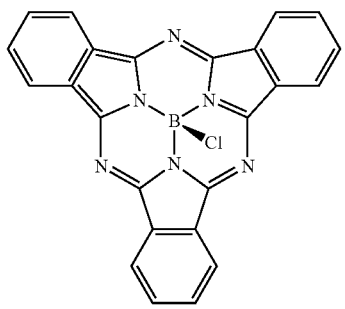

The compound represented by the above Chemical Formula 2a is evaluated regarding light-absorption characteristic depending on a wavelength. The light-absorption characteristic may be evaluated by radiating an ultraviolet (UV)-visible ray (UV-Vis) using a Cary 5000 UV spectroscope (Varian Inc.).

Figure 5:
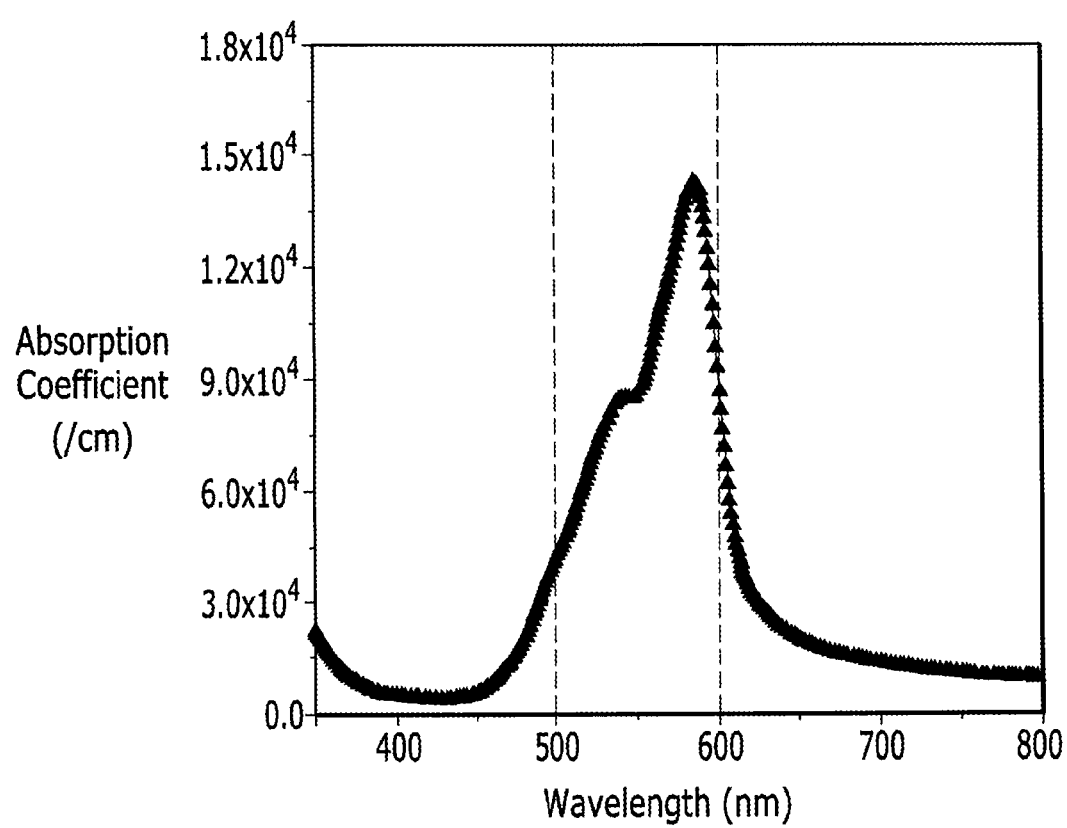
FIG. 5 is a graph showing the extinction coefficient represented by Chemical Formula 2a depending on a wavelength.

FIG. 5 is a graph showing an extinction coefficient of the compound represented by Chemical Formula 2a depending on a wavelength.

Referring to FIG. 5, the compound represented by the above Chemical Formula 2a has a maximum absorption peak in a wavelength region of about 500 nm to about 600 nm, for example, a full width at half maximum of about 80 nm. Accordingly, the compound selectively absorbs light in a green wavelength region.

Fabrication of Organic Photoelectric Device

Example 1

ITO is sputtered on a glass substrate to form an about 100 nm-thick anode, and a molybdenum oxide (MoOx) thin membrane as a charge auxiliary layer is formed thereon. A 90 nm-thick active layer is formed by codepositing a compound represented by the above Chemical Formula 1a' as a p-type semiconductor and another compound represented by the above Chemical Formula 2a as an n-type semiconductor in a ratio of 1:1. Aluminum (Al) is sputtered to form an 80 nm-thick cathode on the active layer, thereby fabricating an organic photoelectric device.

Comparative Example 1

An organic photoelectric device is fabricated according to the same method as Example 1, except for using fullerene ($C_{60}$) instead of a compound represented by the above Chemical Formula 2a as an n-type semiconductor.

Comparative Example 2

An organic photoelectric device is fabricated according to the same method as Example 1, except for using a compound represented by the above Chemical Formula 2a instead of the one represented by the above Chemical Formula 1a' as a p-type semiconductor and another compound represented by the following Chemical Formula A instead of the one represented by the above Chemical Formula 2a as an n-type semiconductor.

[Chemical Formula A]

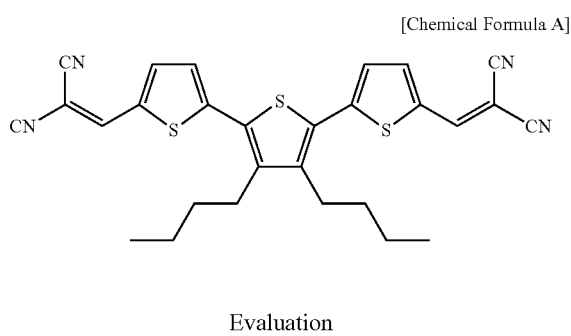

Evaluation

Evaluation 1

The organic photoelectric devices according to Example 1 and Comparative Examples 1 and 2 are evaluated regarding external quantum efficiency (EQE) depending on a wavelength.

The external quantum efficiency is measured using an IPCE measurement system (McScience Inc., Korea). The IPCE measurement system is calibrated using an Si photodiode (Hamamatsu Co., Japan), and the organic photoelectric devices according to Example 1 and Comparative Examples 1 and 2 are respectively equipped therewith and measured regarding external quantum efficiency at a wavelength ranging from about 350 nm to 700 nm.

Figure 6:
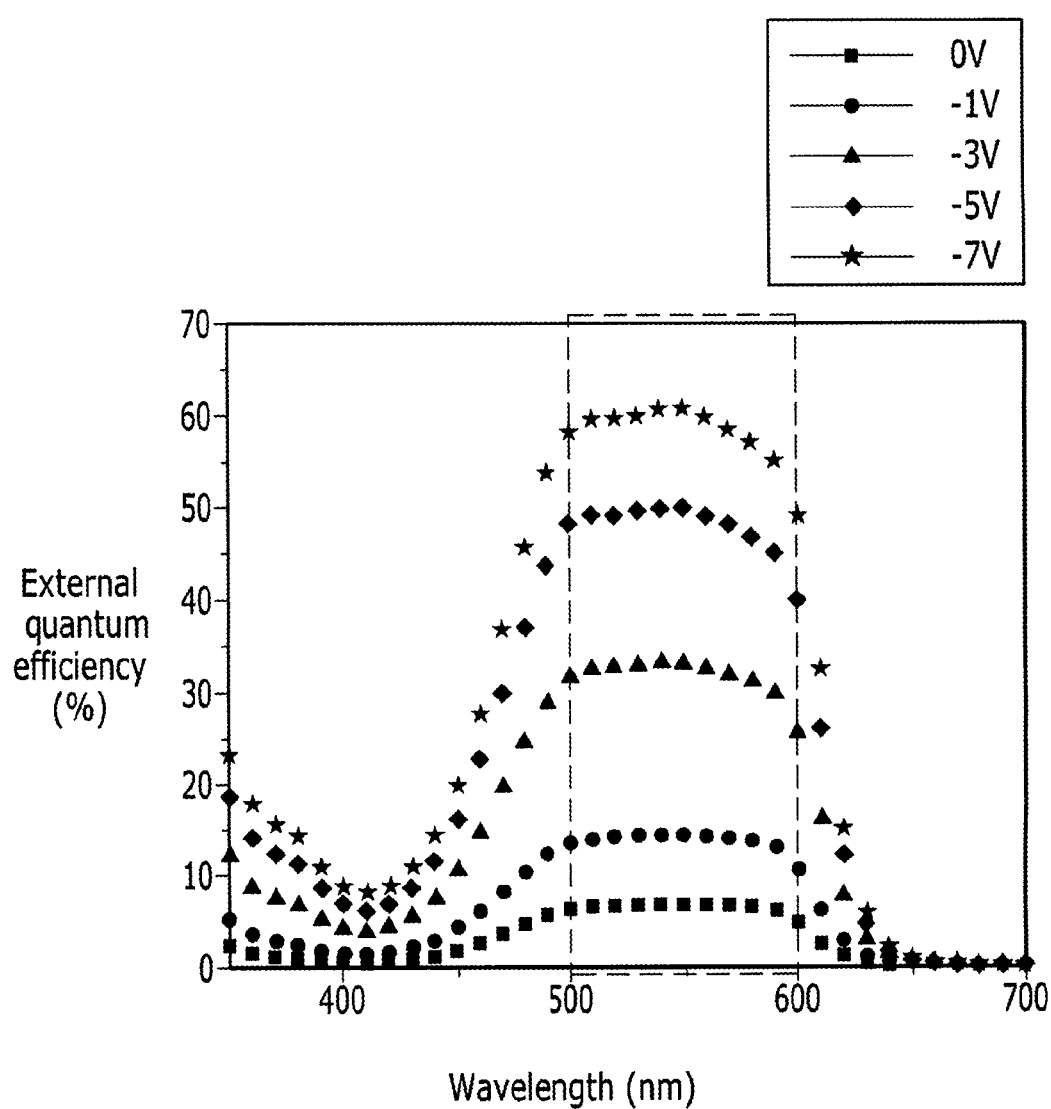
FIGS. 6 to 8 are graphs respectively showing external quantum efficiency of the organic photoelectric devices according to Example 1 and Comparative Examples 1 and 2 depending on a wavelength.
Figure 7:
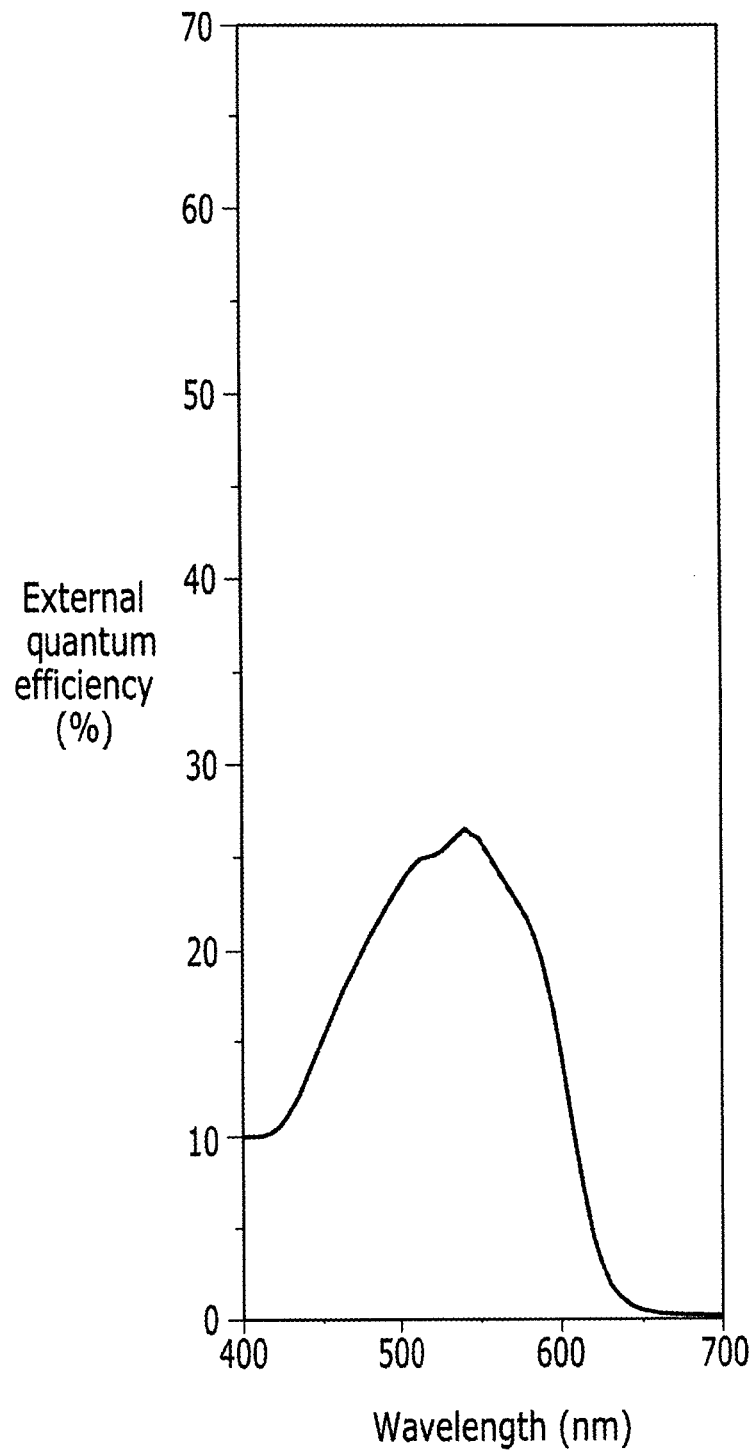
Figure 8:
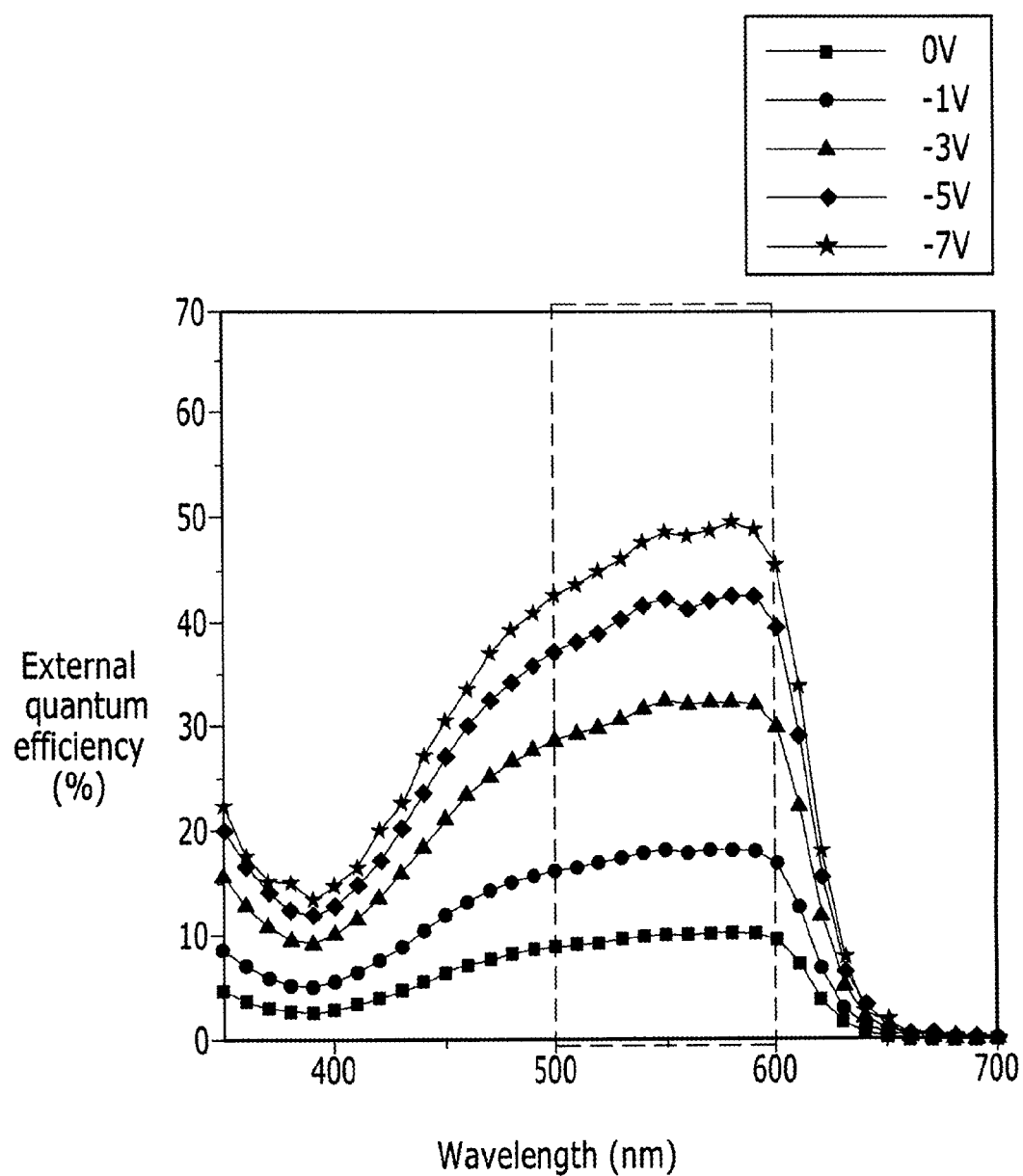

FIGS. 6 to 8 are graphs respectively showing external quantum efficiency of the organic photoelectric devices according to Example 1 and Comparative Examples 1 and 2 depending on a wavelength.

Referring to FIG. 6, the organic photoelectric device according to Example 1 has a maximum external quantum efficiency (EQE) peak in a green wavelength region ranging from about 500 nm to 600 nm. In addition, the organic photoelectric device has efficiency of about 60.8% at about 580 nm when a voltage of −7 V is applied thereto, and herein, has a full width at half maximum of 147 nm.

On the contrary, referring to FIG. 7, the organic photoelectric device according to Comparative Example 1 has no maximum external quantum efficiency (EQE) peak in a green wavelength region ranging from about 500 nm to 600 nm and has deteriorated external quantum efficiency (EQE) in the wavelength region. When $C_{60}$ is used as an n-type semiconductor, the n-type semiconductor has an absorption wavelength region covering all the ultraviolet (UV) and visible light region and allows for photoelectric efficiency by light absorbed in the organic photoelectric device.

Referring to FIG. 8, the organic photoelectric device according to Comparative Example 2 has maximum efficiency of 49.4% at about 580 nm when a voltage of −7 V is applied and less efficiency than the one according to Example 1, and a larger full width at half maximum of 183 nm, which is larger than the one according to Example 1.

Evaluation 2

The organic photoelectric devices according to Example 1 and Comparative Example 2 are measured regarding current density, while various biases are applied thereto.

Figure 9:
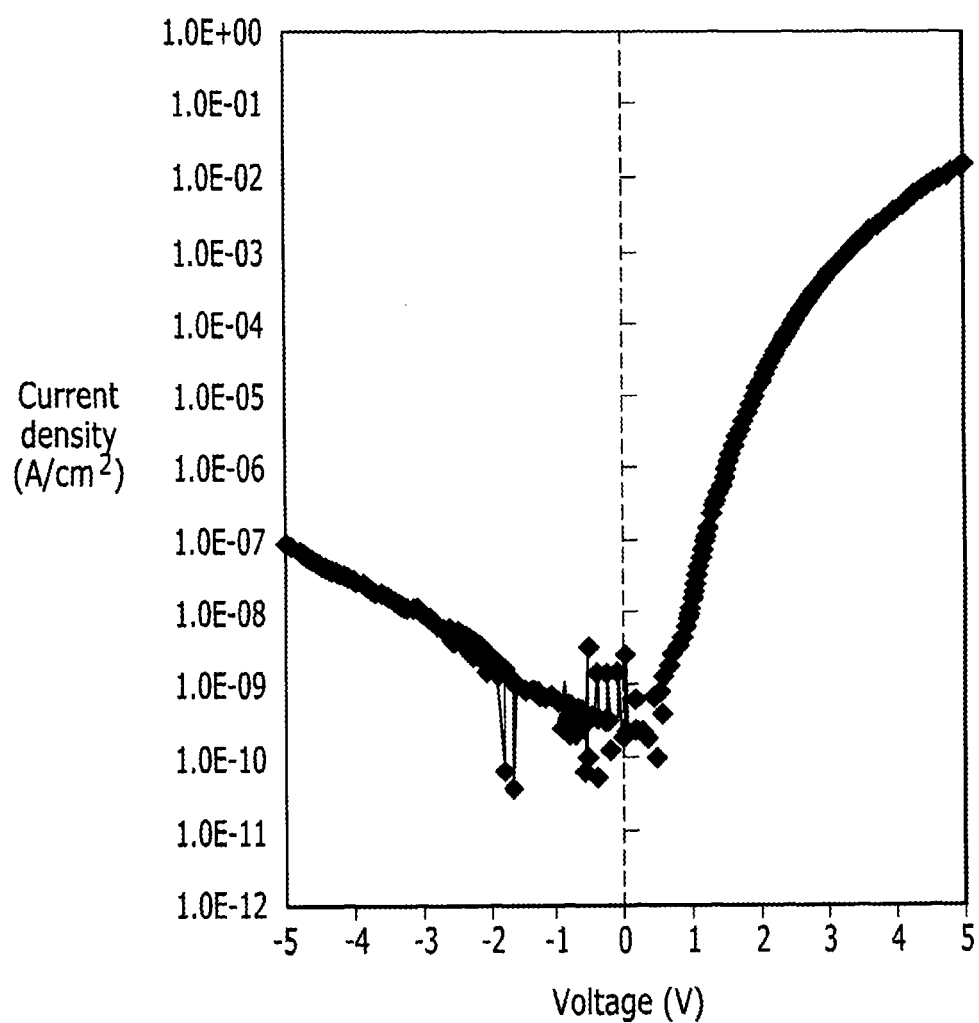
FIG. 9 is a graph showing current density of the organic photoelectric device according to Example 1 depending on a voltage.
Figure 10:
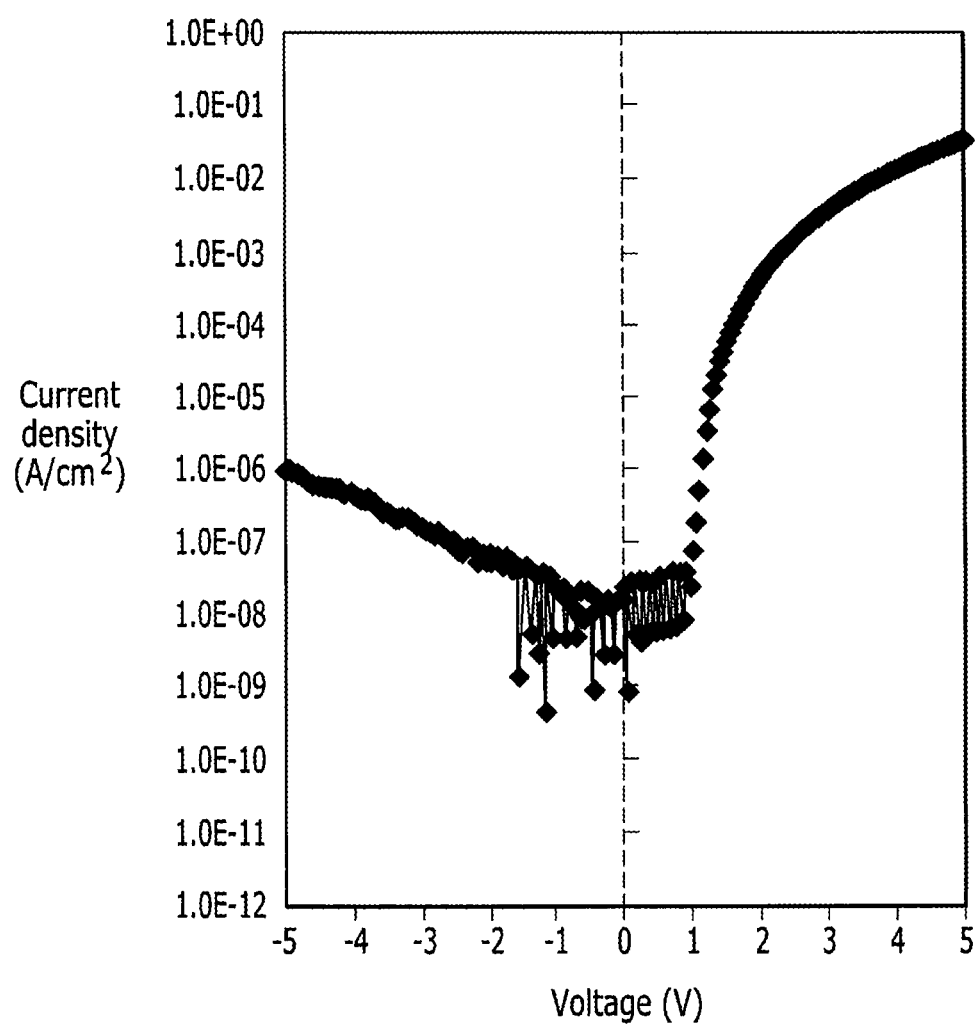
FIG. 10 is a graph showing current density of the organic photoelectric device according to Comparative Example 2 depending on a voltage.

FIG. 9 is a graph showing current density of the organic photoelectric device according to Example 1 depending on a voltage, and FIG. 10 is a graph showing current density of the organic photoelectric device according to Comparative Example 2 depending on a voltage.

Referring to FIGS. 9 and 10, the organic photoelectric device according to Example 1 has suppressed current flow in a reverse voltage direction, while the organic photoelectric device according to Comparative Example 2 has a relatively high current in a reverse voltage direction and thus has a relatively large leakage current.

Evaluation 3

The organic photoelectric device according to Example 1 is allowed to stand at 100° C. for 30 minutes and evaluated regarding current characteristic.

Figure 11:
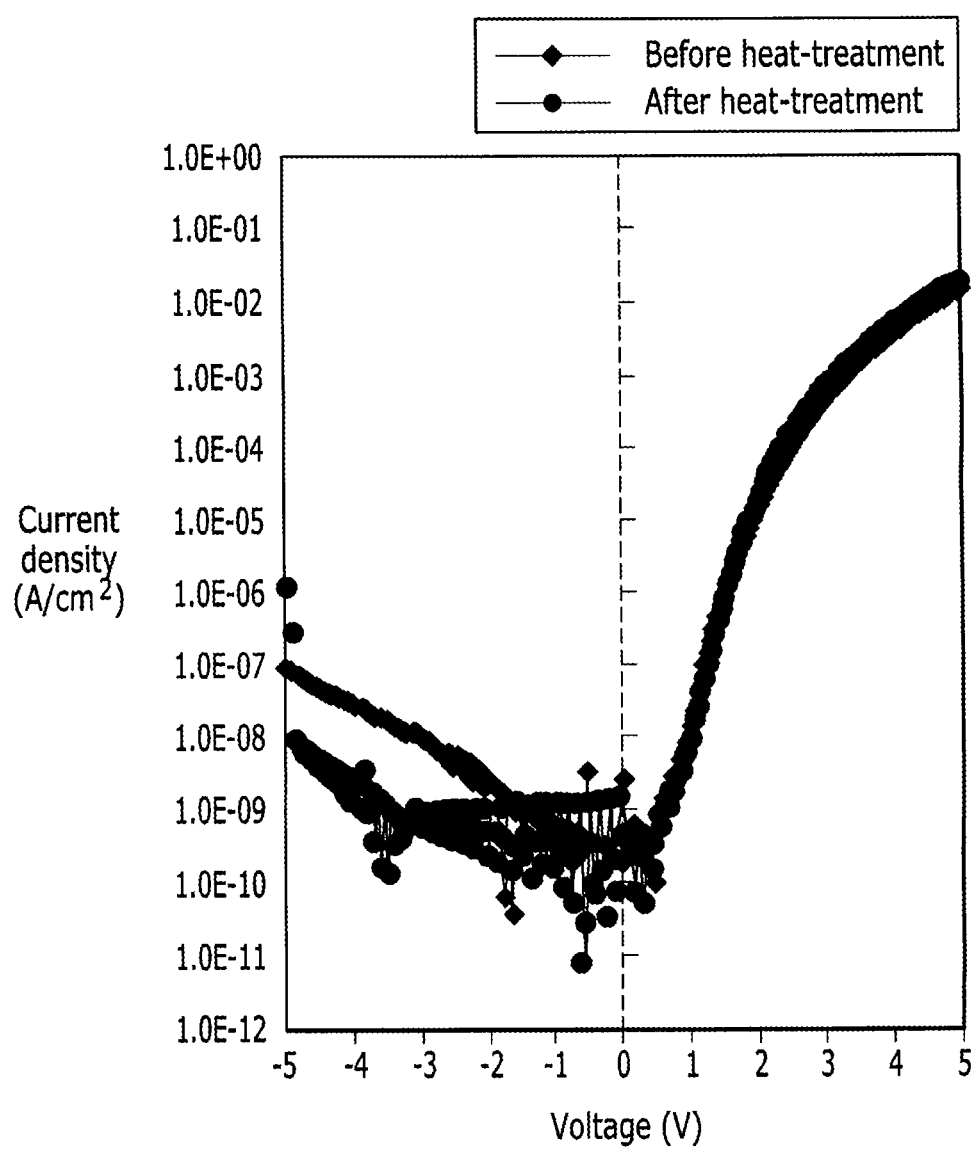
FIG. 11 is a graph showing thermal stability of the organic photoelectric device according to Example 1.

FIG. 11 is a graph showing thermal stability of the organic photoelectric device according to Example 1.

Referring to FIG. 11, when the organic photoelectric device according to Example 1 is allowed to stand at 100° C. for 30 minutes, the organic photoelectric device has almost no current characteristic change. Accordingly, the organic photoelectric device according to Example 1 has relatively high thermal stability.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectric device comprising:

a first electrode and a second electrode facing each other; and an active layer between the first electrode and the second electrode, the active layer including a compound represented by the following Chemical Formula 1 and a compound represented by the following Chemical For-mula 2:

[Chemical Formula 1]

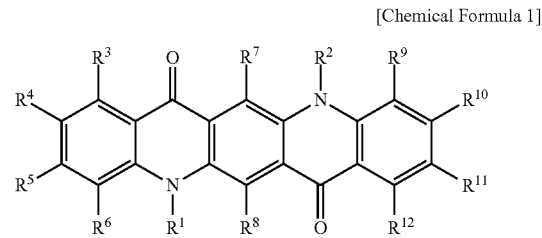

wherein, in Chemical Formula 1, each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, and a combination thereof, and each of $R^3$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, a halogen atom, a halogen-containing group, and a combination thereof,

[Chemical Formula 2]

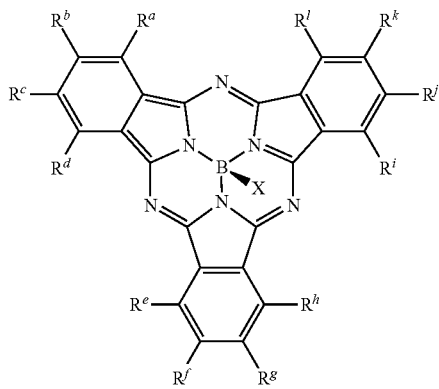

wherein, in Chemical Formula 2,
each of $R^a$ to $R^l$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and
X is an anion.

2. The organic photoelectric device of claim 1, wherein the compound represented by the above Chemical Formula 1 includes at least one selected from compounds represented by the following Chemical Formulae 1a to 1e:

[Chemical Formula 1a]

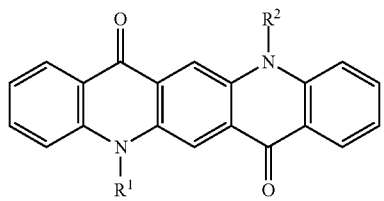

[Chemical Formula 1b]

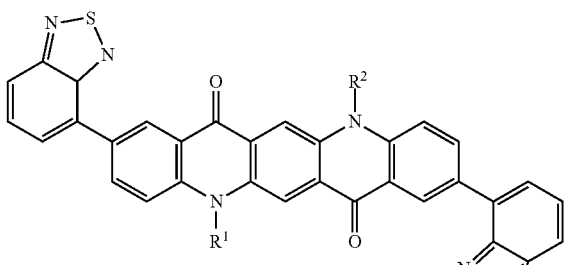

[Chemical Formula 1c]

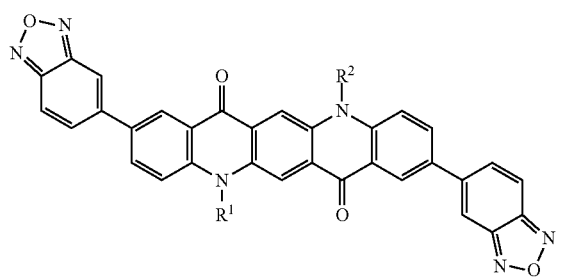

[Chemical Formula 1d]

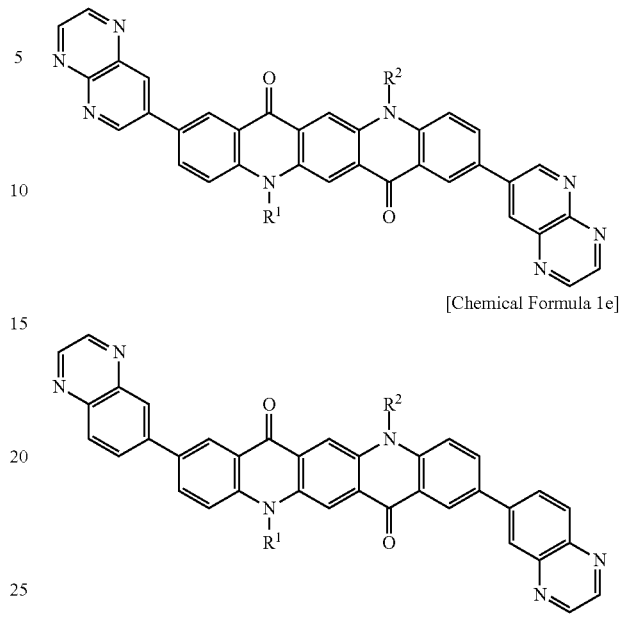

[Chemical Formula 1e]

wherein, in Chemical Formulae 1a to 1e,
each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

3. The organic photoelectric device of claim 1, wherein at least one of $R^a$ to $R^l$ of Chemical Formula 2 includes a halogen atom.

4. The organic photoelectric device of claim 1, wherein the compound represented by the above Chemical Formula 2 includes at least one of compounds represented by the following Chemical Formulae 2a to 2e:

[Chemical Formula 2a]

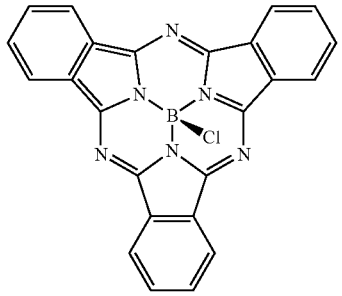

[Chemical Formula 2b]

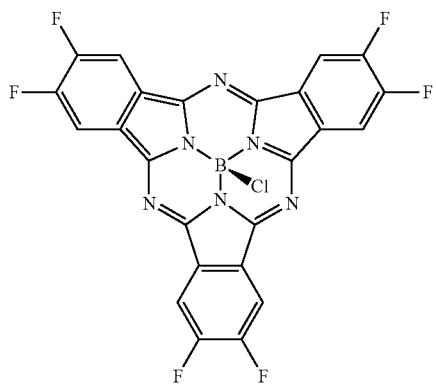

-continued

[Chemical Formula 2c]

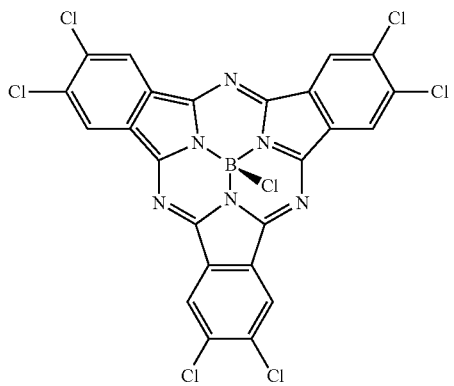

[Chemical Formula 2d]

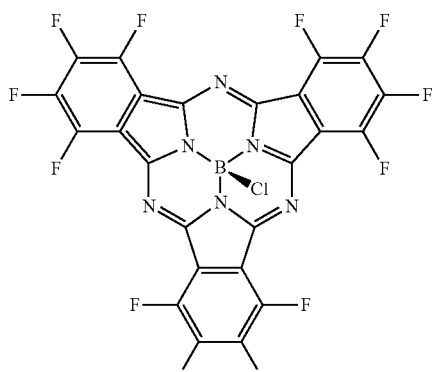

[Chemical Formula 2e]

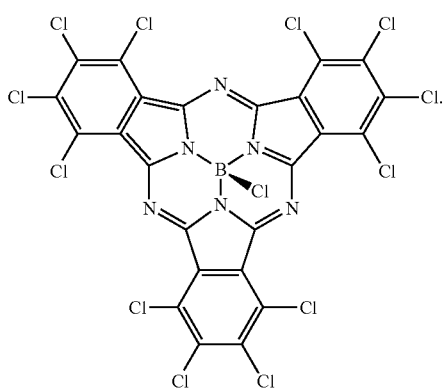

5. The organic photoelectric device of claim 1, wherein the compound represented by the above Chemical Formula 1 is a p-type semiconductor, and the compound represented by the above Chemical Formula 2 is an n-type semiconductor.

6. The organic photoelectric device of claim 1, wherein the active layer selectively absorbs light at a green wavelength region.

7. The organic photoelectric device of claim 1, wherein the active layer has a maximum absorption peak in a wavelength region of about 500 nm to about 600 nm.

8. The organic photoelectric device of claim 1, wherein the active layer has a light-absorption curve having a full width at half maximum (FWHM) of about 50 nm to 150 nm.

9. The organic photoelectric device of claim 1, wherein the active layer includes an intrinsic layer including the compound represented by the above Chemical Formula 1 and the compound represented by the above Chemical Formula 2 at a ratio of about 1:100 to about 100:1.

10. The organic photoelectric device of claim 9, wherein the active layer includes the intrinsic layer including the compound represented by the above Chemical Formula 1 and the compound represented by the above Chemical Formula 2 at a ratio of about 1:10 to about 10:1.

11. The organic photoelectric device of claim 9, wherein the active layer further comprises a p-type layer including the compound represented by the above Chemical Formula 1.

12. The organic photoelectric device of claim 9, wherein the active layer further comprises an n-type layer including the compound represented by the above Chemical Formula 2.

13. The organic photoelectric device of claim 9, wherein the active layer further comprises:
a p-type layer on one side of the intrinsic layer, the p-type layer including the compound represented by the above Chemical Formula 1, and
an n-type layer on the other side of the intrinsic layer, the n-type layer including the compound represented by the above Chemical Formula 2.

14. The organic photoelectric device of claim 1, wherein the active layer comprises a p-type layer including the compound represented by the above Chemical Formula 1 and an n-type layer including the compound represented by the above Chemical Formula 2.

15. The organic photoelectric device of claim 1, further comprising:
a charge auxiliary layer between at least one of the first electrode and the second electrode and the active layer.

16. The organic photoelectric device of claim 1, wherein the first electrode is an anode and the second electrode is a cathode.

17. An image sensor comprising the organic photoelectric device according to claim 1.

18. The organic photoelectric device of claim 1, wherein the compound represented by Chemical Formula 1 is a p-type semiconductor,
the compound represented by Chemical Formula 2 is an n-type semiconductor, and
the p-type semiconductor and the n-type semiconductor form a pn junction.

* * * * *